United States Patent [19]

Shenton et al.

[11] Patent Number: 4,613,940

[45] Date of Patent: Sep. 23, 1986

[54] METHOD AND STRUCTURE FOR USE IN DESIGNING AND BUILDING ELECTRONIC SYSTEMS IN INTEGRATED CIRCUITS

[75] Inventors: Graham Shenton, Monte Sereno; Ioan G. Jones, Los Gatos; David W. Lucas; Ronald E. Barton, both of Saratoga, all of Calif.

[73] Assignee: International Microelectronic Products, San Jose, Calif.

[21] Appl. No.: 440,283

[22] Filed: Nov. 9, 1982

[51] Int. Cl.[4] .......................................... G06F 15/606
[52] U.S. Cl. .................................. 364/490; 364/488; 364/491
[58] Field of Search ............................... 364/488–491; 307/303

[56] References Cited

U.S. PATENT DOCUMENTS 3,654,615  4/1972  Freitag .............................. 364/491
4,377,849  3/1983  Finger et al. ...................... 364/491

OTHER PUBLICATIONS

IEEE Circuits & Systems Int'l Sypm, 1980 (vol. 3); "Graph-Oriented Approach to the Layout Problem"; R. Otten et al., pp. 956–959.
17th Design Automation Conference, Jun. 23–25, 1980; "The Genealogical Approach to the Layout Problem"; A. A. Szepieniec et al., pp. 535–542.
IEEE Spectrum, Jun. 1982 (v 19 N 6); "Automating Chip Layout"; S. Trimberger, pp. 38–45.
Int'l Con. Comp. Aid. Des., Apr. 15–18, 1969; "The Automatic Design of Interconnection Patterns for L.S.I."; P. E. Radley, pp. 114–121.
Int'l Conf C.A.D., Apr. 15–18, 1969; "Computer-Aided Production of Masks for Silicon I.C.'s", J. Wood et al., pp. 122–129.
IBM Tech. Dis. Bulletin, Oct. 1970, (V 13 N 5); "Producing Integrated Circuits from a Circuit Logic Input", O. Bilous et al., pp. 1084–1089.
IEEE Trans on Elec Dev, Apr. 1979, (v. ED-26 N. 4); "Data Processing System of Electron-Beam Lithography for VLSI Microfabrication", Sugiyama et al., pp. 675–685.
"Computer Oriented Circuit Design", F. F. Kuo et al., Prentice-Hall, 1969, pp. 19–23, 523–530.

Primary Examiner—Felix D. Gruber
Assistant Examiner—Kevin J. Teska
Attorney, Agent, or Firm—Flehr, Hohbach, Test, Albritton & Herbert

[57] ABSTRACT

A method of designing an integrated circuit layout based on primitive elements such as transistors, resistors, and conductors and cell structures formed from the primitive functional element. The primitive elements are defined by surface dimensions, semiconductor construction, and surface layers and can be placed to accommodate special cell structures and functions. Design time can be minimized by using preexisting cell structures stored in suitable computer means, or layout surface and production costs can be minimized by designing new cell structures using a simple technique. Process independence can be achieved by having a complete design based on a small number of primitive elements which can be readily modified.

2 Claims, 10 Drawing Figures

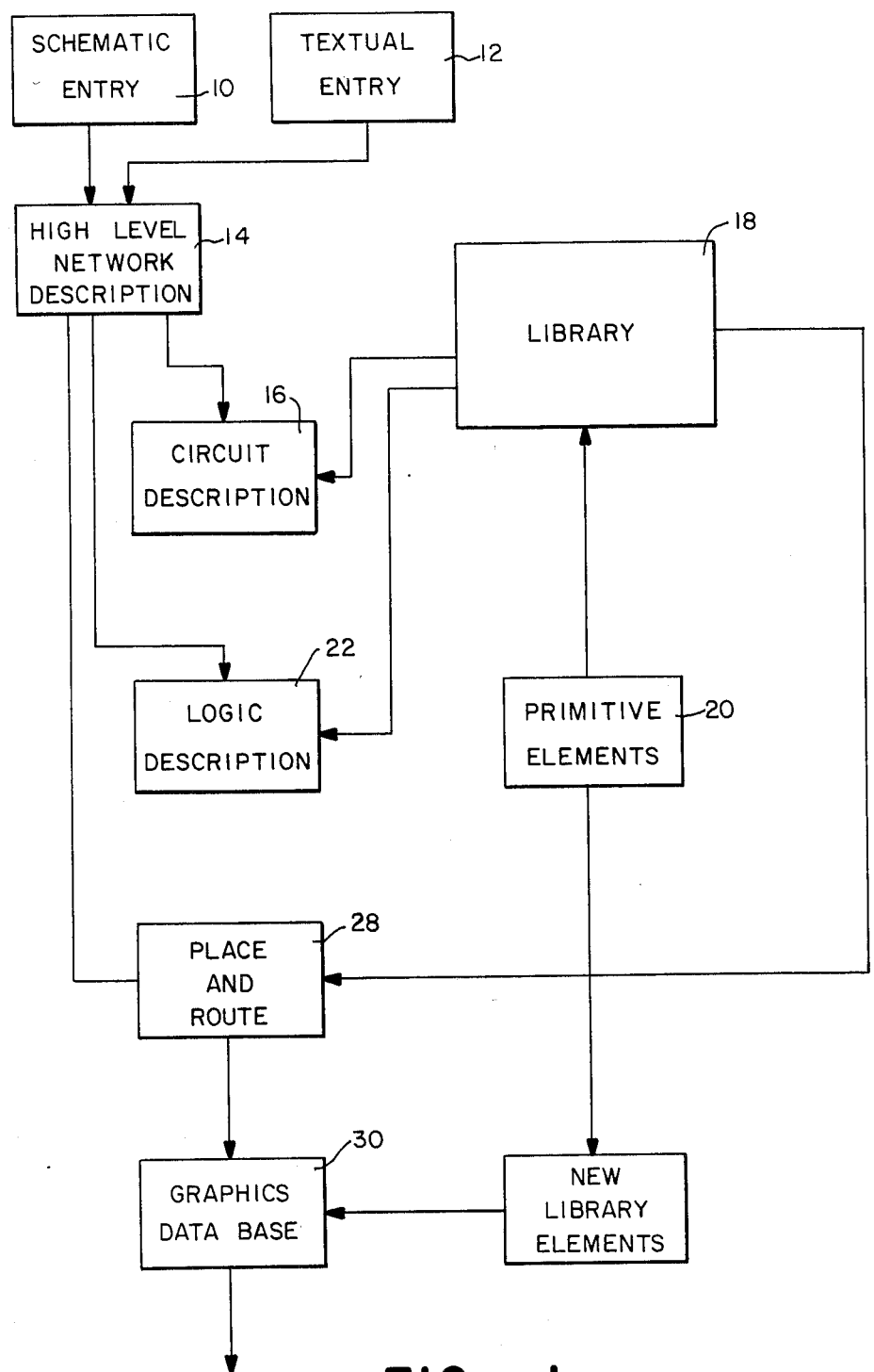
FIG. —1

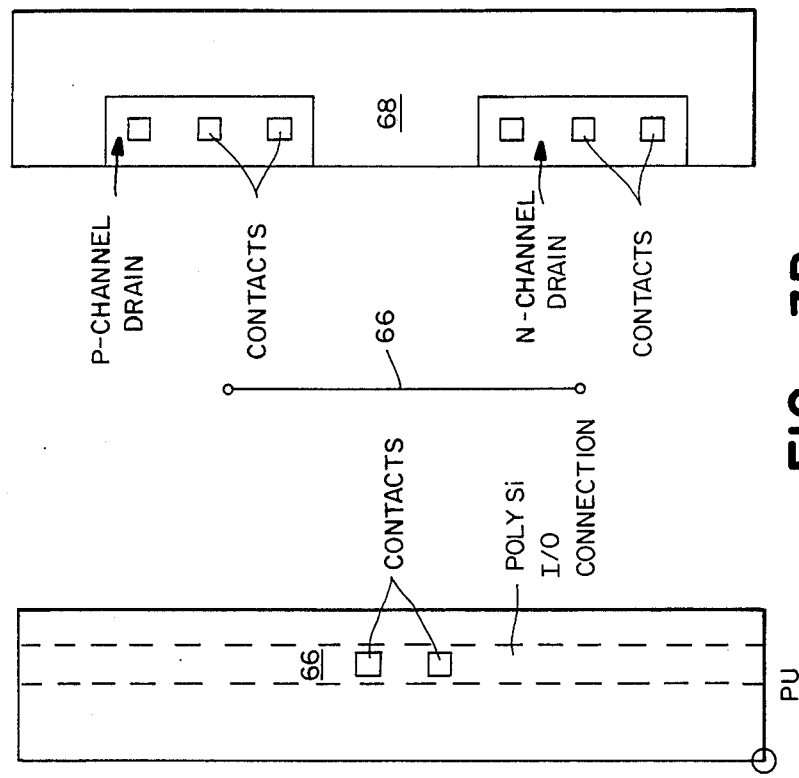
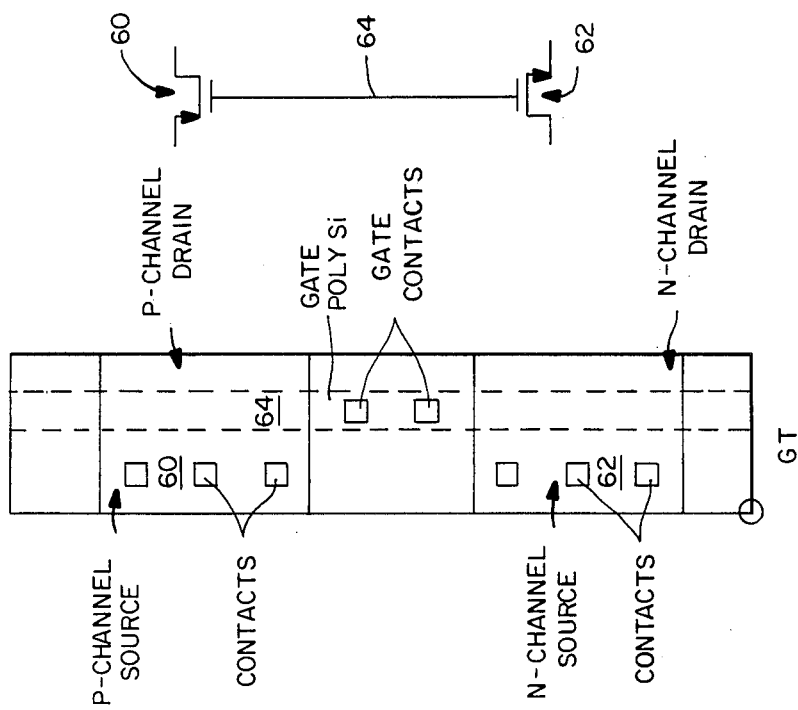

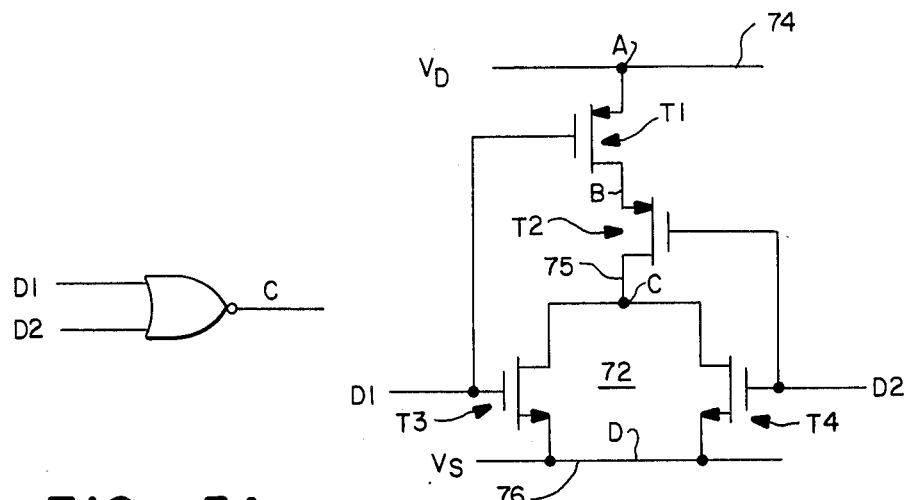
FIG.—5A
FIG.—5B
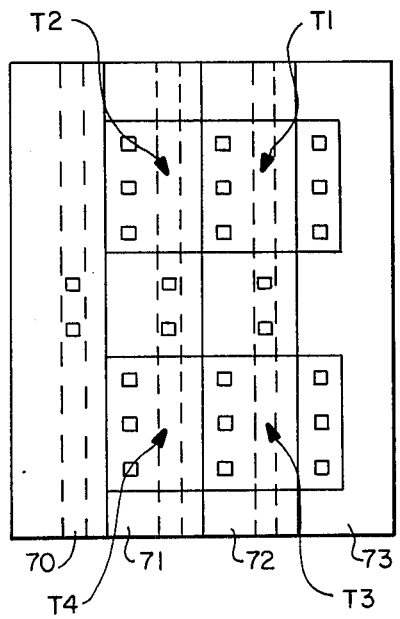
FIG.—6A
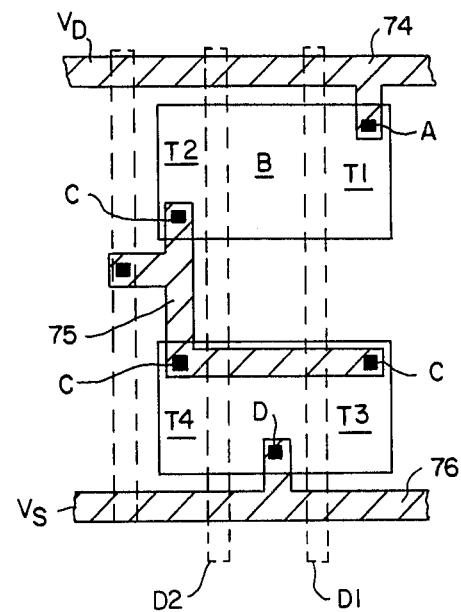
FIG.—6B

METHOD AND STRUCTURE FOR USE IN DESIGNING AND BUILDING ELECTRONIC SYSTEMS IN INTEGRATED CIRCUITS

This invention relates generally to semiconductor integrated circuit technology, and more particularly the invention relates to the design and layout of electronic systems in integrated circuits using functional building blocks and to the structures of the functional building blocks.

The fabrication of electrical circuits which are integrated in semiconductor chips requires the selective introduction of dopants into the semiconductor chips using photoresist masking and chemical etching techniques. As circuit components become smaller and the integrated circuits become more complex, the definition of the circuit layout to maximize chip surface utilization becomes increasingly important and difficult.

Heretofore, a number of techniques have been employed in the design and layout of integrated circuits and systems. The oldest technique is the hand drawn layout. This method is most flexible and can make maximum use of a semiconductor surface area. However, a hand drawn layout can be very time consuming and the finished design is usually limited to a specific fabrication process. Further, a hand drawn layout is error prone.

Computer aided design (CAD) is becoming more important in laying out large scale and very large scale integrated circuit designs. A summary of CAD applications is given by Trimberger, "Automating Chip Layout", IEEE Spectrum, June 1982, pgs. 38-45. Described therein are four methods which allow computer automation in translating the specification of an integrated circuit into the photolithographic masks necessary for fabricating the circuit.

Use of "standard cells" allows a large library of predefined cells to be stored in the layout system. A designer specifies the cells which are needed and the kinds of connections that will be required between the cells, and the computer system then assigns the cells to a position on a semiconductor chip and determines the metallization routes for connecting the cells. By predefining the blocks of logic, design time is accelerated. However, the cell designs are process specific and must be individually created in terms of topology. Moreover, the cells cannot be readily altered without extensive engineering and design effort.

The gate array is a prefabricated chip containing a large number of identical cells or blocks of logic which are arranged in arrays. The designer specifies the logic function to be performed, and the computer system selects the cells needed and establishes wiring routes among them. Again, design time is accelerated, however the gate array is a very inefficient use of silicon.

The programmed logic array (PLA) is a chip containing two different arrays of logic gates which in series can perform any Boolean logic operation. The designer supplies the PLA layout system with the general logic equations, and the system then selects the signals to be included in the array gates to implement the equations. The technique is inefficient in using the silicon chip, and is limited in the functions which can be implemented.

The standard floor plan contains a generic structure for a chip layout but without specified sizes and contents thereof. This technique has been used in microprocessor data paths and similar designs.

Each of these prior art techniques can be efficiently employed for specific applications. However, all of the techniques have limitations in semiconductor chip utilization and are process limited. Moreover, if improperly used unacceptable chip layouts will result.

Symbolic design and the use of stick diagrams have also been employed. The use of symbols to represent single items or combinations of topological items can reduce design time but with more limited flexibility and reduced area efficiency. Stick diagrams are a short hand method for designing an integrated circuit based on simplified design rules. The method is almost as flexible as hand drawn layouts, and can be used in conjunction with other methods to design a complete integrated circuit. However, the algorithms used for manipulating the shapes usually alter the intended configuration and make interface from one block to another more difficult. The final result is variable and hence unpredictable in topology and electrical performance.

The present invention is directed to a more flexible method of integrated circuit design and layout which can be implemented by computer means and which is not process limited. System design can be implemented in reduced time with a high degree of process independence. The invention allows a combination of design aids which can be modified easily to perform a desired function.

Briefly, in accordance with the invention a limited plurality of primitive elements are defined for use in "bottom up" designing of an integrated circuit layout. Each of the primitive elements is defined by semiconductor chip surface dimensions, semiconductor construction, and surface layers. Importantly, the specifics of each primitive element can be varied within its total dimensions. A plurality of cell structures are then designed based on the primitive elements and on a predetermined grid structure. The circuit components of the integrated circuit are then correlated to the cell structures and the primitive elements. Computer means can then operate on the correlated cell structures and the primitive elements to define the optimum layout for the integrated circuit. Importantly, the definition of primitive elements within selected cell structures can be varied as required for circuit implementation.

Accordingly, the design of functional blocks used in laying out the integrated circuit begins at the most elemental level and proceeds upwardly to cell structures and logic functions whereby the user can enter at the level of his expertise or need without a knowledge of the underlying semiconductor fabrication process and without a knowledge of semiconductor circuit layout. While the catalog of cell structures increases, the user through the computer system retains the ability to alter cell structures and add cell structures as well as use the existing cell structures. The method is flexible, accurate, and consistent in use. By arranging for all the primitive elements to lie on a uniform grid, the interconnection of logical functions by means of automatic placement and routing becomes a simple task for state of the art software.

The predefined shapes are crucial, and much work in cell construction can be saved from careful design of the 'primitive' elements. Any number of primitives can be designed, but too many primitives would become cumbersome in use, and should not be needed if they were carefully designed. Experience has shown that six primitives will cover many logic design styles.

Once the primitive elements are designed, they are placed next to each other in a way which is suitable for the electrical function required. The connection paths between the primitives are entered as a string of coordinate points and contacts between the available layers. This placement and connection list requires minimal process information such as the available layer names. The coordinate points are function of the chosen grid size only. This information is stored in a data file which is used to construct the electrical cell.

Process independence comes from this small number of primitive elements. Variations to a process such as larger gate electrode overlap of diffusion, changes in contact dimension, changing from single diffusion for N and P to two separate diffusion masks (i.e. process design rules) can be made by simply modifying the primitive cells. This is true for increase or decrease in geometry, so the primitives can easily be changed from a three micron to a five micron design or from three micron to two micron or one micron.

Such changes to a custom designed circuit would mean a complete redesign, and a symbolic or sticks design would need an extensive rework of the symbol set and rules.

As geometries are reduced, the rules used to design the masks become more complex, and the submicron changes to the mask geometries (sometimes known as skewing or biasing) become more important. Performing post design adjustments on existing designs is not always practical, and at best can take many hours of computer time.

By preprocessing each primitive, computer time can be saved in the task of sorting the data into ascending X, ascending Y then fracturing the data into necessary size and shape requirements for the purpose of making masks.

Compared to other methods of design it is possible to reduce the use of time consuming graphical terminals. These are usually slow in response time due to the large numbers of coordinate points required to reconstruct graphical shapes, and limited in availability due to high cost. Some output is needed to verify correctness or efficiency of data using the primitive element design system. This can be put onto a line printer in a symbolic way for preliminary checking, or plotted directly onto color or electrostatic plotters for a final verification.

Another time saving feature is that of design rule checking. With a hand-drawn design where the designer has complete freedom, each component drawn must be checked for dimensional accuracy in itself or in relation to adjacent shapes. This is known as design rule checking and is commonly a part of computer aided design packages. It takes several hours of computer time to run because of the mathematical calculations required to satisfy a full check. The output is typically verbose and takes a long time to understand, and even longer to correct. This is less of a problem with symbolic or stick layout methods, however these distribute the single task of design rule checking over the design process by continually performing design rule checks during the placement of symbols or during the compaction algorithm. The primitive elements only have to be checked once, alone and in conjunction with one another.

The invention and objects and features thereof will be more readily apparent from the following description and appended claims when taken with the drawing, in which:

FIG. 1 is a functional block diagram illustrating the process of designing and laying out an integrated circuit in accordance with the invention.

FIG. 2A and FIG. 2B are a top view of a primitive element and electrical schematic, respectively, in accordance with one embodiment of the invention.

FIG. 3A and FIG. 3B are a plan view and an electrical schematic, respectively, of another primitive element in accordance with the invention.

FIG. 4 is a plan view of another embodiment of a primitive element useful in the invention.

FIG. 5A and FIG. 5B are a logic symbol and electrical schematic of a NOR gate illustrating one application of the invention.

FIG. 6A and FIG. 6B illustrate the steps in laying out the NOR gate circuit of FIGS. 5A and 5B using the primitive element of FIGS. 2A, 2B, 3A, 3B, and 4.

Referring now to the drawings, FIG. 1 is a functional block diagram illustrating generally the method of designing and building electronic systems in accordance with the invention. The system allows the designer to make complex design decisions. For example, if the design requirement is to implement a TTL design with minimum design time and cost, the schematic entry 10 and textual entry 12 proceed through the high level network description 14 to a circuit description 16 which is implemented from existing functional components in the library 18. The library 18 consists of a software description of the cell structures based on the primitive elements at 20.

Alternatively, if more engineering effort is justified in the form of developing new functional elements or in the planning of the layout because of high production volume, then more design time can be spent with subsequent reduction in silicon area and production cost savings. The high level network description 14 is then implemented through the logic description function 22 which may use components from the library 18, with or without alterations, or entirely new components can be generated based on defined primitive elements. The graphics for the semiconductor array are defined in a place and route function 28 which optimally places the library components and new library elements using a graphics data base 30.

The library of functional blocks exists at various levels such as logic, transistor, layout, and represent to the designer the fundamental design components of the system. For the system designer, a range of the most commonly used functional elements defined in terms of particular process implementation, are available from which to construct systems.

Consider now one implementation of the method in accordance with the invention. A logical NOR gate will be designed using three primitive functional elements arranged on a common grid. The general format is chosen to be a sixteen micron grid in the X direction and ten micron grid in the Y direction. In FIGS. 2A and 2B a plan view and electrical schematic, respectively, are shown for a C-mos gate cell comprising two interconnected field effect transistors 60 and 62 in a silicon substrate. A doped polysilicon conductor 64 interconnects the gates of the two transistors.

FIG. 3A and FIG. 3B illustrate in plan view and schematically an underpass cell which consists of a single polysilicon conductor 66 which lies on the grid structure and can be placed next to the other cells such as illustrated in FIG. 2A.

FIG. 4 is a diffusion primitive element 68 useful with the primitive of FIG. 2A for interconnection purposes.

The primitive elements shown in FIGS. 2-4 will now be used to implement the logic NOR gate shown symbolically in FIG. 5A and schematically in FIG. 5B. The implementation shown in FIG. 6A includes one underpass element 70 (such as shown in FIG. 3A), two transistor structures 71 and 72 (such as shown in FIG. 2A), and one diffusion primitive element 73 (such as shown in FIG. 6A). Transistors T1 and T2 are serially interconnected, the transistors T3 and T4 are connected in parallel, and the underpass 70 is the gate output and interconnects to the drains of transistors T3 and T4 primitive elements 71 and 72, all as shown in FIG. 5B. As shown in FIG. 6B, bus metallization 74 is provided to be the source of transistor T1 of the primitive element 72, metallization 75 interconnects transistor T2 in primitive element 71 to both transistors T3 and T4 in the primitive elements 71 and 72, and metallization 76 is connected to the sources of the transistors T3 and T4 in primitive elements 71 and 72.

Thus, one cell structure defining a logic NOR gate is designed and stored in the library. The information necessary in laying out the cell must be translated into a form suitable for a pattern generator or similar mask making apparatus. First, the placement of the primitive elements is described as

| underpass | location | 1 |
| gate | location | 2 |
| gate | location | 4 |
| diffusion | location | 5 |

To distinguish this placement of primitive elements as a NOR gate in place of any other gate, some characteristics or personality must be added. This is the interconnect shown in FIG. 6B and is entered as follows:

| G2X | D2 | D4X |
| B2X | A2 | |
| B6X | A6 | |
| I6X | J6 | |
| E1X | E2 | |

The numbers and characters used are a simple X-Y grid structure superimposed onto the cell structure. The letter X denotes a contact from metal to diffusion or metal to polysilicon.

Having previously entered the primitive elements as graphical information, all the information is now in place to construct complete NOR gate. With this gate one can create more complex cells for functional circuitry.

The process in accordance with the present invention offers more flexibility and freedom in designing and laying out semiconductor circuits than do known prior art techniques. As compared to the gate array design, for example, considerable efficiency in silicon area is obtained since the elements within each functional block are fitted together in an optimum way rather than utilizing a fixed underlying array. Additionally, the functional blocks can be assembled as closely as dictated by the individual design interconnect rather than being restricted to a fixed size of an interconnect channel. As compared with complete hand drawn custom designs, cells from the library can actually be smaller than the full hand drawn design since there is rarely enough time to optimize each cell in the hand drawn design. By a careful examination of a large number of custom chips it has been observed that a limited number of major sections of the design dominate the chip area. Time spent optimizing these sections can be profitably spent. However, time spent optimizing the rest of the more random areas is often unproductive and can be more efficiently accomplished by using a cell library.

In summary, the process in accordance with the present invention allows the flexibility of designer implemented cells as well as the use of preexisting cells stored in the system library. A designer then has freedom and latitude to maximize circuit layout and production efficiency or minimize design time, as desired. Further, designer implemented cells are quick and accurate in construction, and require only a minimum of semiconductor technology design and process expertise. Their performance can be easily predicted.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A method for use in designing an integrated circuit layout on a semiconductor wafer comprising the steps of providing an alterable description of a plurality of primitive elements including transistors, resistors, and conductors, said primitive elements being defined by surface dimensions, semiconductor construction, and surface layers, whereby said primitive elements can be assembled to form all structures for selected circuit functions, designing a plurality of cell structures based on said primitive elements and on a predetermined grid structure, and correlating circuit components of said integrated circuit to said cell structures and said primitive elements, whereby cell structures and circuit components are computer modified by altering descriptions of said primitive elements.

2. For use in designing an integrated circuit layout, a plurality of primitive elements including transistors, resistors, and conductors, said primitive elements being defined by surface dimensions, semiconductor construction, and surface layers whereby said primitive elements are assembled to form cell structures for selected circuit functions, said cell structures being modified by changing definitions of said primitive elements.

* * * * *